United States Patent [19]

Beery

[11] Patent Number: 4,624,560

[45] Date of Patent: Nov. 25, 1986

[54] CAPSULE RUPTURE PRINTING SYSTEM

[75] Inventor: Jack Beery, Fremont, Calif.

[73] Assignee: ITT Corporation, New York, N.Y.

[21] Appl. No.: 791,179

[22] Filed: Oct. 25, 1985

[51] Int. Cl.$^4$ ............ G03B 27/32; G03B 27/52; G03C 1/72
[52] U.S. Cl. .................................... 355/27; 355/100; 430/138
[58] Field of Search ............ 355/27, 100; 430/138, 430/211, 962, 235

[56] References Cited

U.S. PATENT DOCUMENTS

| | | | |
|---|---|---|---|
| 3,386,824 | 6/1968 | Miller | 430/138 |
| 4,399,209 | 8/1983 | Sanders et al. | 430/138 |
| 4,448,516 | 5/1984 | Arney et al. | 355/27 |
| 4,533,615 | 8/1985 | Arney et al. | 430/138 |

OTHER PUBLICATIONS

Electronic Imaging, Oct. 1984, Photocapsule Process for Hardcopy Output.

Primary Examiner—Richard A. Wintercorn
Attorney, Agent, or Firm—T. L. Peterson; J. M. May

[57] ABSTRACT

Apparatus is provided for use in printing systems wherein regions of rupturable subminiature capsules of a layer of capsules are ruptured to release dye that prints an image on an image-receiving sheet. A thin backing sheet is positioned so the layer of capsules lies between the backing sheet and the image-receiving sheet. A rotating brush brushes against a rear face of the backing sheet which is opposite the capsules, to apply pressure against multiple small independent areas of the backing sheet, to deflect each small area of the backing sheet towards the image-receiving sheet to rupture the capsules between them and thereby transfer the dye to the image-receiving sheet.

10 Claims, 4 Drawing Figures

CAPSULE RUPTURE PRINTING SYSTEM

BACKGROUND OF THE INVENTION

A recently developed printing process involves coating of an image-receiving sheet with a layer of subminiature capsules. Each capsule contains a radiation sensitive dye, or ink, composition. It may be noted that the dye sometimes requires a developer in order to color the image-receiving sheet, and such a dye precursor or dye is herein referred to simply as a dye. A pattern of light of the sensitizing wavelength is directed at the layer of capsules, such as light reflected from an original to be copied or directed through multiple miniature shutters controlled by data signals. The light increases viscosity, or tends to harden, the liquid contents, sometimes herein referred to as dye, in those capsules on which it falls. When the layer of capsules are against the image-receiving sheet, pressure is applied to the capsules to rupture them and flow dye from those capsules not exposed to light, onto the image-receiving sheet and print an image thereon. Those capsules whose ink composition has been hardened can still be ruptured, although they resist rupturing more than non-hardened capsules. Furthermore, even when a hardened capsule is ruptured, its viscous dye will resist flowing and it generally does not release dye.

Pressure for rupturing the capsules has often been accomplished by placing the image-receiving sheet with a layer of capsules thereon between a pair of pressure rolls. The pressure rolls would exert forces of 200-400 pounds per linear inch to break the capsules. Such pressure rolls have the disadvantage that they can calendar the paper, and the pressure rolls have to be large and precision made and mounted, with the difficulty increasing as the width of the image increases. Such pressure rolls which apply high pressures have a tendency to wrinkle the paper and to cause paper jams. Another approach, shown in U.S. Pat. No. 4,448,516 involves the application of a brush which directly brushes the layer of capsules to rupture them and allow the dye to flow into the sheet which carries the capsules. This has a disadvantage that some of the dye can be picked up by the bristles of the brush and applied to areas of the image-receiving sheet which are not to be dyed (at least with that color of dye). Printing systems which could use photosensitive rupturable capsules, and which avoided the disadvantages of prior rupturing systems, would be of considerable value.

SUMMARY OF THE INVENTION

In accordance with one embodiment of the present invention, apparatus is provided for forming an image on an image-receiving sheet by the rupture of dye-containing capsules lying against the sheet, which avoids many of the disadvantages of the prior art. A flexible thin backing sheet has a front face which lies against the layer of capsules so the capsules are sandwiched between the backing sheet and the image-receiving sheet. Means are provided for resiliently applying pressure to at least one small area of the rear face of the backing sheet, at one instant of time, to rupture the rupturable capsules lying opposite the small area. At other instants, pressure is applied to other small areas until the total area containing the image to be transferred to the image-receiving sheet has been exposed to pressure to rupture the capsules thereat.

The pressures can be applied by a brush having a multiplicity of bristles which press against the rear face of the backing. The brush bristles are moved against substantially all areas of the backing which lie opposite the area of the image-receiving sheet which is to receive the image.

The novel features of the invention are set forth with particularity in the appended claims. The invention will be best understood from the following description when read in conjunction with the accompanying drawings.

DESCRIPTION OF THE PREFERRED EMBODIMENT

Figure 1:
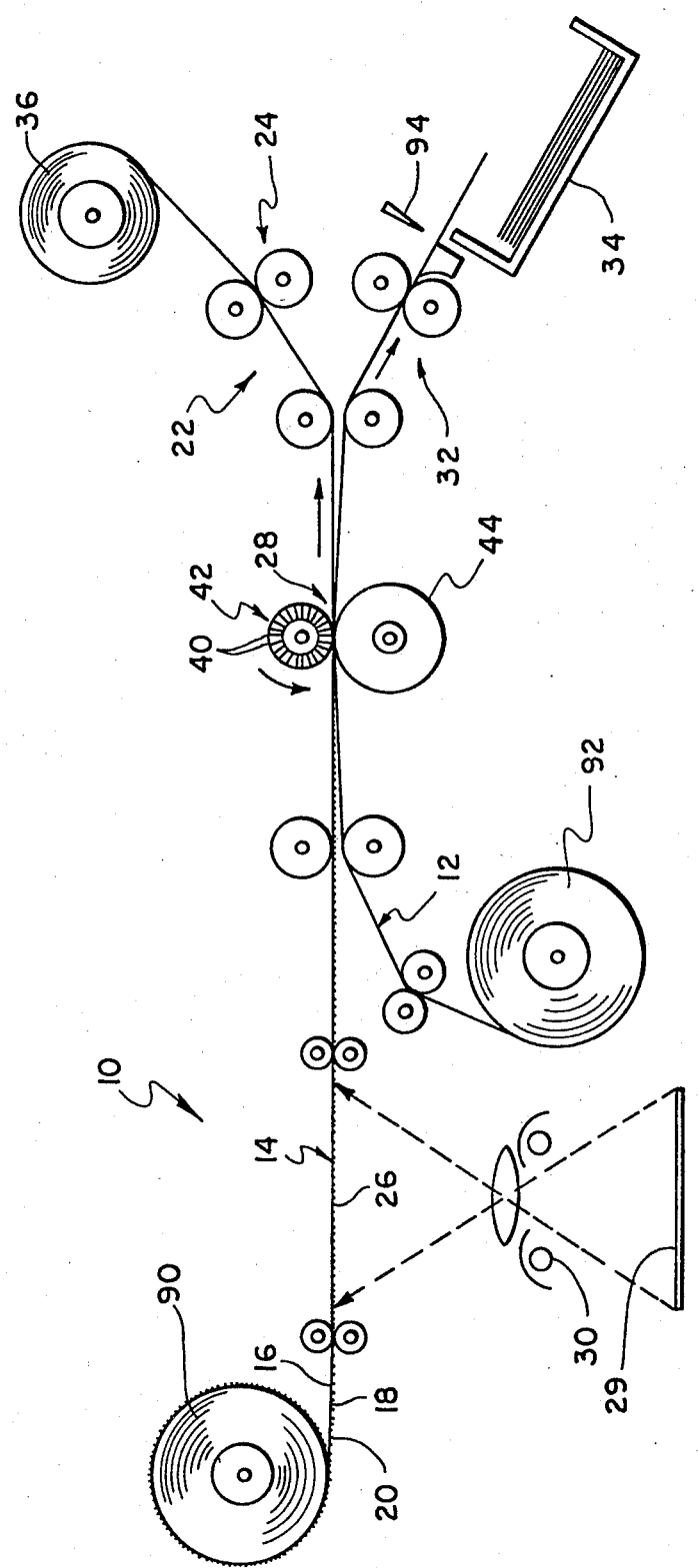
FIG. 1 is a side elevation view of a printing apparatus constructed in accordance with the present invention.

FIG. 1 illustrates a system 10 for forming images on an image-receiving copy sheet 12. A flexible backing sheet 14 is used, which has rear and front faces 16, 18 and a layer 20 of capsules lying on its front face. A backing sheet transport 22 which includes pairs of rollers such as 24, moves the backing sheet past an imaging station 26 and a transfer station 28. The capsules in layer 20 are originally rupturable to release dye. At the imaging station 26, light from lamps 30 is reflected from a sheet 29 containing an image to be printed. The light is imaged onto the capsule layer 20 to harden the dye of those capsules which receive light, and to leave unchanged as rupturable dye-releasing capsules, those capsules which do not receive a sufficiently high level of light. Another transport means 32 is provided for moving the image-receiving sheet 12 through the transfer station 28. At the transfer station 28, the backing and image-receiving sheets 14, 12 lie adjacent to one another, with the layer of capsules 20 sandwiched between them. At the transfer station, the rupturable dye-releasing capsules are ruptured to release their dye and transfer the dye onto the image-receiving sheet (where the dye may be developed) and form an image thereon. The image-receiving sheet is then moved to a receiver 34, while the backing sheet is moved to a take-up reel 36.

Figure 2:
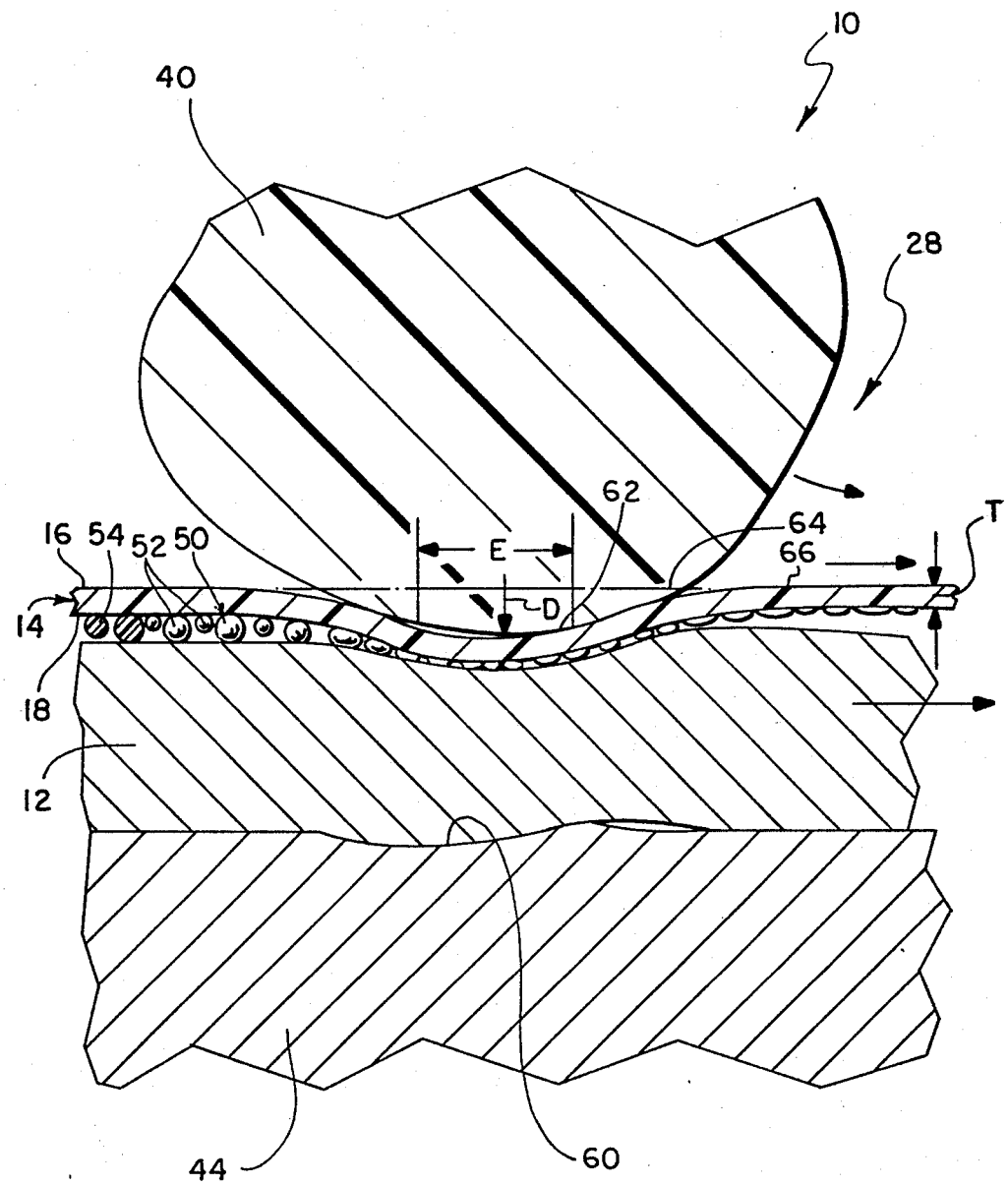
FIG. 2 is a greatly enlarged sectional view of a portion of the system in FIG. 1.

At the transfer station 28, sufficient pressure is applied to the rear face 16 of the backing sheet to rupture the capsules. Such pressure is applied by the bristles 40 of a brush 42. A rotating platen 44 is provided opposite the brush to support the image-receiving sheet and support the capsules lying against it, as the brush presses against the rear of the backing sheet. FIG. 2 is a greatly enlarged view of the system at the area of the transfer station 28, showing the manner in which the capsules are ruptured. This figure shows the capsules 50 which are mounted on the front face 18 of the backing sheet 14. This figure shows most of the capsules at 52 as rupturable ink or dye-releasable capsules, which, when they lie under a bristle 40, are ruptured and their dye flows onto the image-receiving sheet 12. The figure also shows other capsules 54 which were hardened by exposure to a high level of light. These hardened capsules resist rupture, and even if ruptured, greatly resist the release of dye because the dye is highly viscous. In a typical system the average diameter of the capsules 50 is about 7 to 10 microns. Applicant uses a very thin backing sheet 14 of a thickness T less than one hundred microns, or four thousandths inch, and preferably no more than about 12 microns. One inch equals 25.4 microns, and a micron is sometimes written as "micrometer" because it is one-millionth of a meter. The capsule width is almost always less than 24 microns.

A typical sheet of paper 12 has a thickness on the order of four thousandths inch. In one type of prior art system, the capsules 50 lay directly on the image-receiving sheet 12 (over a layer of development material thereon) and a steel pressure roll was applied directly to the capsules such as 50 to squeeze them and the image-receiving sheet between the pressure roll and the platen (which was also a roll). If the pressure roll or platen had a recess such as shown at 60, which might be the result of a scratch on the roll surface, or dust or other contamination buildup, then the rupturable capsules lying opposite the recess (especially if it were in the roll instead of the platen) might not be ruptured, and the image might display a thin undyed line. To prevent this, the rolls apply very high pressures which had many disadvantages such as calendaring the paper, requiring heavy precision rolls and bearings, wrinkling the paper, and causing jams in the small clearance between the rolls. Another approach was to apply a rotating brush directly against the capsules 50 which lay directly on the image-receiving sheet (over a developer layer). However, the bristles of the brush could pick up some of the dye and apply it to an area of the sheet which was not intended to be colored to thereby create an unwanted offset or ghost image.

In the system 10 of the present invention, the small areas of pressure resiliently applied to rupture the capsules, are applied through the thin backing sheet 14 to the capsules. The small bristles each press, at any instant, on a relatively small area 62 of the backing sheet, and the small thickness of the backing sheet allows the pressured area to deform out of the plane 64 of adjacent areas such as 66 of the backing sheet. Thus, even if the image-receiving sheet 12 is of uneven thickness or the platen has a small recess such as 60 from a scratch or nick, the localization of the resiliently applied pressure allows the pressure to be applied to the capsules lying over the small depressed area.

Each small area 62 to which pressure is applied, is spaced from any other area to which similar pressure is applied, and is very small with the area 62 being less than one hundredth square inch and having a width of the same order of magnitude as its length. Also, the pressure is resiliently applied, in that the pressure remains largely constant (within 50% of its maximum value) throughout deflection of the depressed area 62 by a distance E which is at least two thousandth inch. The resilient deflecting force applies a largely constant pressure or force, throughout a deflection of at least two thousandth inch of the area of the backing sheet with respect to adjacent areas (lying within one centimeter). Bond paper, which is a common image-receiving sheet, has fibers at its surface, and forms valleys of a depth of perhaps a thousandth inch between groups of such fibers. The pressure applied resiliently to small areas, allows the backing and capsules thereon to be deflected at least partially into such valleys between fibers.

Figure 3:
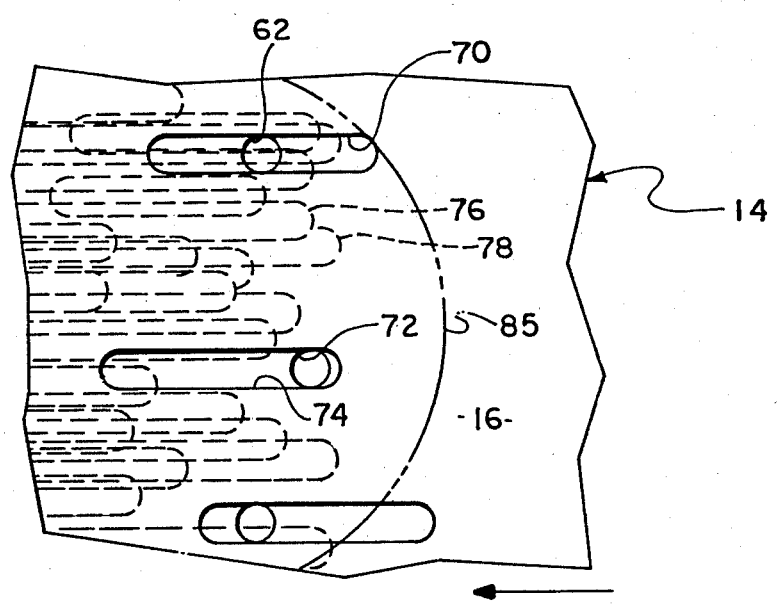
FIG. 3 is a plan view of a portion of the backing sheet of the apparatus in FIG. 1.

FIG. 3 shows the small area 62 over which the bristle 40 in FIG. 2 is applying pressure to the rear face 16 of the backing sheet. As the bristle moves across the backing sheet, its footprint passes over an area such as shown at 70. At the same time, another bristle presses against another small area 72 on the backing sheet, and the footprint of that bristle is shown at 74. The footprints 62, 72 are spaced apart, so that the area of the backing sheet around the footprint 62 can deform to accommodate the deflection in the footprint area 62. With numerous rotating bristles on the brush, other bristles will press on overlapping areas of the backing sheet indicated by the elongated areas such as 76, 78. The pressured areas overlap so that the small areas such as 62 will cover substantially all of the area of the backing sheet which lies opposite an image to be printed on the image-receiving sheet.

Unlike a roll which has only one "shot" at breaking the capsules and transferring the ink, a brush presses multiple times against each area of the backing sheet. This increases the possibility that one of the pressings will rupture at least the unhardened capsules. While both a spiral wound brush and a non-spiral brush can be used, applicant prefers a spiral brush because it tends to produce a more uniform pressure and consequent image. It is also possible to use a nonrotating brush, such as a flat brush which is moved back and forth across the width of the backing.

Figure 4:
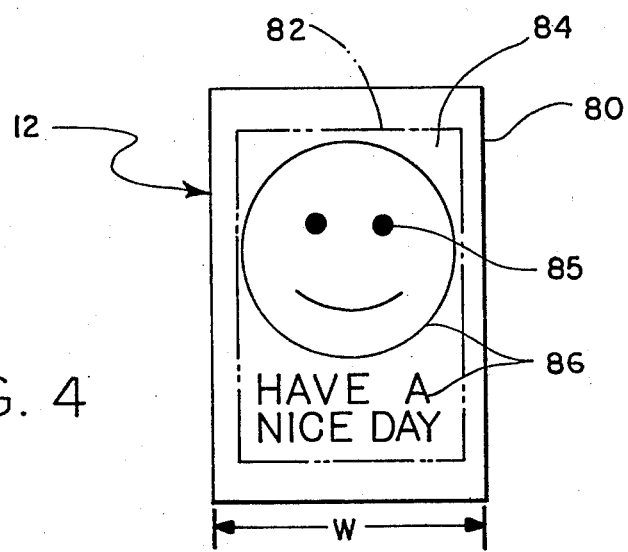
FIG. 4 is a plan view of a copy sheet with the image thereon which is printed by the apparatus of FIG. 3.

FIG. 4 illustrates a portion 80 of the image-receiving sheet and shows in imaginary lines at 82, the boundaries of an image-containing area 84 (including a circle 85) within which an image 86 lies. While the image-receiving sheet may have a width W such as 8½ inches, the image area may have a smaller width, and it is possible that the brush will brush less than the entire width of the image-receiving sheet, although it will brush all areas containing the image which is to be transferred to the image-receiving sheet.

In the system of FIG. 1, the backing sheet is shown as extending from a supply roll 90 to a take-up reel 36. The image-receiving sheet extends from a supply roll 92 to a cutter 94 that cuts portions of the sheet into final sheets of limited length. Although applicant has used the term "sheet" to describe the backing and image-receiving sheets, applicant uses this term to describe some or a portion of something that is thin in comparision to its length and width.

Applicant has built and tested a capsule rupturing apparatus based on the principles of the present invention. Applicant has used backing sheets of polyester having thicknesses of 6, 9, and 12 microns, with a 6 micron film working best. Large area capsule breakage did not occur with polyester sheets of a thickness greater than 12 microns. However, breakage can occur for thicker sheets using other backing material, with the backing in any case being less than 100 microns and preferably less than 25 microns (one thousandth inch). The brush 42 was a cylindrical brush having an outside diameter of 3 inches, and bristles having a diamter of 9 mil (1 mil equals one thousandth inch; one mil also equals 25.4 microns) and a length of 11/16th inch. The bristles were of nylon, type 6.6. The image-receiving sheet 12 lay on a flat granite platen, and the brush had an interference with the granite platen of 0.045 inch. Applicant made several exposures on layers of capsules, and found that when ruptured by the above-mentioned apparatus, applicant obtained a resolution of 948.6 dots per inch, or 18.7 line pairs per millimeter. The brush rotated in the same direction as the sheets were fed, but with a peripheral brush speed much more than twice that of the backing and image-receiving sheets.

It is preferred that the capsules be bonded to the front face of the backing sheet 16, so the capsules lie against the backing at an early time which is prior to the capsules reaching the transfer station. This avoids positioning capsules on the image-receiving sheet, and the possibility that a hardened capsule with developer on it will later tint the image-receiving sheet. This also avoids any deleterious effects of having not completely transparent capsules on white areas of the image-receiving sheet. The more common presently available photosensitive dyes require a developer to create a colored area on the image-receiving sheet. The developer can be applied in a number of ways, including applying it to the image-receiving sheet prior or after the transfer station, or including additional rupturable capsules which contain developer rather than dye, or including free developer in the capsule coating layer.

Thus, the invention provides a method and apparatus for fracturing subminiature (less than 1 mil diameter) capsules against an image-receiving sheet, in a manner that assures that substantially all rupturable capsules will be ruptured and which avoids the production of ghosts or offset images, all in a relatively simple and low cost rupturing mechanism. This can be accomplished by applying pressure to at least one and generally many small areas (each less than one hundredth square inch area) to a thin backing sheet which is preferably less than 1 mil thick, while a layer of capsules lies between the backing sheet and the image-receiving sheet on which the image is to be printed. At another instant, pressure is similarly applied to other small spaced areas until the total area of the backing sheet lying against the layer of capsules that formed the image has been subjected to pressure. A brush can be used which has numerous bristles that are pressed against the rear face of the backing, with the brush moved to move the bristles against all areas of the backing which lie against capsules to be ruptured. It is also possible to use a multiplicity of air nozzles to direct air against spaced areas of the backing sheet. It is also possible to use an air plenum.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. Apparatus for forming an image on an image-receiving sheet by the rupture of at least some dye-containing capsules of a layer of capsules, comprising:

means forming a transfer station;
   means for moving said image-receiving sheet past said transfer station;
   a flexible backing sheet which has front and rear faces;
   means for moving said backing sheet past said transfer station with said front face of said backing sheet facing said image-receiving sheet and said image-receiving sheet supported to resist deflection away from said backing sheet at said station;
   said layer of capsules lying on one of said sheets, on a face thereof that faces the other sheet, so the layer of capsules lies sandwiched between said sheets at the transfer station;
   said layer of capsules including rupturable dye-containing capsules lying within an image-containing area within which the image-to-be formed lies;
   means for resiliently applying pressure at an instant, to at least one small area of the rear face of said backing sheet which is spaced from any other small area on the rear face of said backing sheet to which said pressure is simultaneously being applied, in an amount of pressure which ruptures rupturable capsules lying opposite the small area, wherein each small area has an area less than one hundredth square inch, and at other times similarly applying said pressure to other spaced small areas until the total of said small areas cover substantially all of the area of said backing sheet which lies opposite the image-containing area.

2. The apparatus described in claim 1, including:
   a platen lying at said transfer station against a face of said image-receiving sheet which is opposite said backing sheet;
   said backing sheet has a thickness no more than one hundred microns, and said pressing means comprises means for simultaneously applying pressure to a multiplicity of spaced small areas on the rear face of said backing sheet, during movement of each of said small areas towards said platen independently of other of said small areas, whereby to apply sufficient force to rupture capsules lying opposite each of said small areas despite unevenness of the surface of said platen or of the thickness of the image-receiving sheet.

3. The apparatus described in claim 1, wherein:
   said pressing means comprises a cylindrical brush with multiple bristles and means for rotating the brush, the cylindrical surface of said brush positioned to press against the rear face of said backing sheet.

4. An apparatus for forming an image on an image-receiving sheet by rupturing those dye-containing capsules of a layer of capsules which can be ruptured to release dye, against the image-receiving sheet, the improvement comprising:
   a flexible backing having front and rear faces;
   means for moving said backing past said transfer location, with said layer of capsules lying substantially against the front face of said backing, and with said image-receiving sheet lying on a side of said layer of capsules opposite said backing; and
   a brush having a multiplicity of bristles and means for pressing said bristles with sufficient force against the rear face of said backing to rupture said capsules which can be ruptured to release dye, and for moving said brush to move said bristles against all areas of said backing which lie opposite the area of the image-receiving sheet which is to receive the image.

5. The improvement described in claim 4, wherein:
   said baking is away from said image-receiving sheet at an early time prior to said backing reaching said transfer station, and said capsules are attached to the front face of said backing at said early time.

6. The improvement described in claim 4, wherein:
   said backing thickness is less than one hundred microns.

7. A method for rupturing a layer of dye-containing capsules to apply the dye to an image-receiving sheet, comprising:

establishing a front face of the image-receiving sheet and a front face of a backing sheet facewise adjacent to each other with the layer of dye-containing capsules sandwiched between them;

establishing a supporting platen against a rear face of the image-receiving sheet which lies opposite the backing sheet;

simultaneously applying a resilient deflecting force independently against each of a multiplicity of spaced small areas of a rear face of the backing sheet which is opposite said supporting platen, said deflecting forces being sufficient to rupture dye-containing capsules and press the released dye against the image-receiving sheet.

8. The method described in claim 7, including:

establishing said dye-containing capsules in bonding relationship to the front face of said backing sheet to form said layer of capsules thereon, and only thereafter moving said image-receiving sheet facewise adjacent to said backing sheet.

9. The method described in claim 7, wherein:

said step of applying a resilient deflecting force comprises rotating a largely cylindrical brush while it bears against the rear face of said backing sheet.

10. The method described in claim 7, wherein:

said capsules have an average diameter of no more than 24 microns; and said backing sheet has a thickness no greater than about 12 microns, said small areas are spaced apart at any instant and said small areas on said backing sheet each have an area of no more than one hundredth square inch.

* * * * *